US008766673B2

(12) United States Patent
Dominguez et al.

(10) Patent No.: US 8,766,673 B2
(45) Date of Patent: Jul. 1, 2014

(54) SYSTEMS WITH COMPONENTS OPERABLE IN LOW POWER MODES

(75) Inventors: Sergio de Santiago Dominguez, Barcelona (ES); Ignacio Soler Flores, Barcelona (ES); Hua Zhao, Barcelona (ES)

(73) Assignee: Hewlett-Packard Development Company, L.P., Houston, TX (US)

( * ) Notice: Subject to any disclaimer, the term of this patent is extended or adjusted under 35 U.S.C. 154(b) by 32 days.

(21) Appl. No.: 13/560,977

(22) Filed: Jul. 27, 2012

(65) Prior Publication Data

US 2014/0028388 A1  Jan. 30, 2014

(51) Int. Cl.
*H03K 3/00* (2006.01)

(52) U.S. Cl.
USPC .......................................... 327/108

(58) Field of Classification Search
USPC ............................. 361/56; 327/108
See application file for complete search history.

(56) References Cited

U.S. PATENT DOCUMENTS

| 6,442,271 | B1 | 8/2002 | Tuttle et al. | |
|---|---|---|---|---|
| 7,548,401 | B2 * | 6/2009 | Mergens et al. | ................ 361/56 |
| 7,570,089 | B2 | 8/2009 | Ronan et al. | |
| 7,904,838 | B2 | 3/2011 | Balatsos et al. | |
| 2010/0325450 | A1 | 12/2010 | Kendall et al. | |

OTHER PUBLICATIONS

A. Salimath et al., "Simplified 3.3V tolerance circuit for 2.5V I/O design in PCI-X signaling environment," Circuits and Systems, 2009, MWSCAS '09, 52nd IEEE Int'l Midwest Symposium, pp. 491-494, Aug. 2-5, 2009.

* cited by examiner

*Primary Examiner* — Daniel Rojas

(57) ABSTRACT

A system comprises a first component operable in a plurality of modes coupled to a second component via an isolation circuit. The isolation circuit comprises a first diode coupled between a power supply of the first component and an output of the isolation circuit. The output of the isolation circuit is coupled to the second component.

The isolation circuit also comprises a first transistor the base of which is coupled to an output of the first component and one of the collector and emitter of which is coupled to the output of the isolation circuit.

In a low power mode of the first component, parasitic supply from the output of the isolation circuit is blocked from the power supply of the first component and from the output of the first component by the first transistor and the first diode.

16 Claims, 2 Drawing Sheets

SYSTEMS WITH COMPONENTS OPERABLE IN LOW POWER MODES

BACKGROUND

Many devices, such as Large Format Printers, need to meet several saving power consumption regulations like Energy Star or EuP. This can be achieved through the usage of different low power states. These power states adapt to the regulation demands, from the point of view of maximum power allowed and minimum user functionality. The amount of regulatory requirements and therefore the different low power states needed in the system change and increase year by year, making the electronics architecture much more complex and requiring the frequent addition of new system power states.

BRIEF DESCRIPTION OF THE DRAWINGS

Various examples are described below with reference to the accompanying drawings, in which.

DETAILED DESCRIPTION

By definition, a system power state is specified according to the power state of each subsystem that is a part of it. Generally, there are three possible different subsystem power states: subsystem on (fully functional, all supply voltages available, full power consumption), subsystem in a power saving mode (partial functionality, some of the supply voltages not available, reduced power consumption) and subsystem off (no functionality, supply voltages not available, no power consumption).

Subsystems which are part of a global system can share several interconnect signals such as buses or power interfacing signals (wake up or sleep signals). A problem can be that one subsystem, in a power saving mode or simply on in a system power saving state, supplies voltage to another subsystem that must be in an off state through those shared interconnect signals. This can supply a parasitic voltage to subsystems that must be in an off state.

This effect is often most visible in sideband signals like wake up or sleep signals. These signals are normally connected to global input/output pins in microprocessors or companions IC. These pins usually have protection against electrostatic discharge (ESD) using embedded ESD diodes. However, this can create an inverse input voltage path from the pin to the supply power of the IC, allowing for the supply of parasitic voltage to the IC when it is in an off state.

Figure 1:
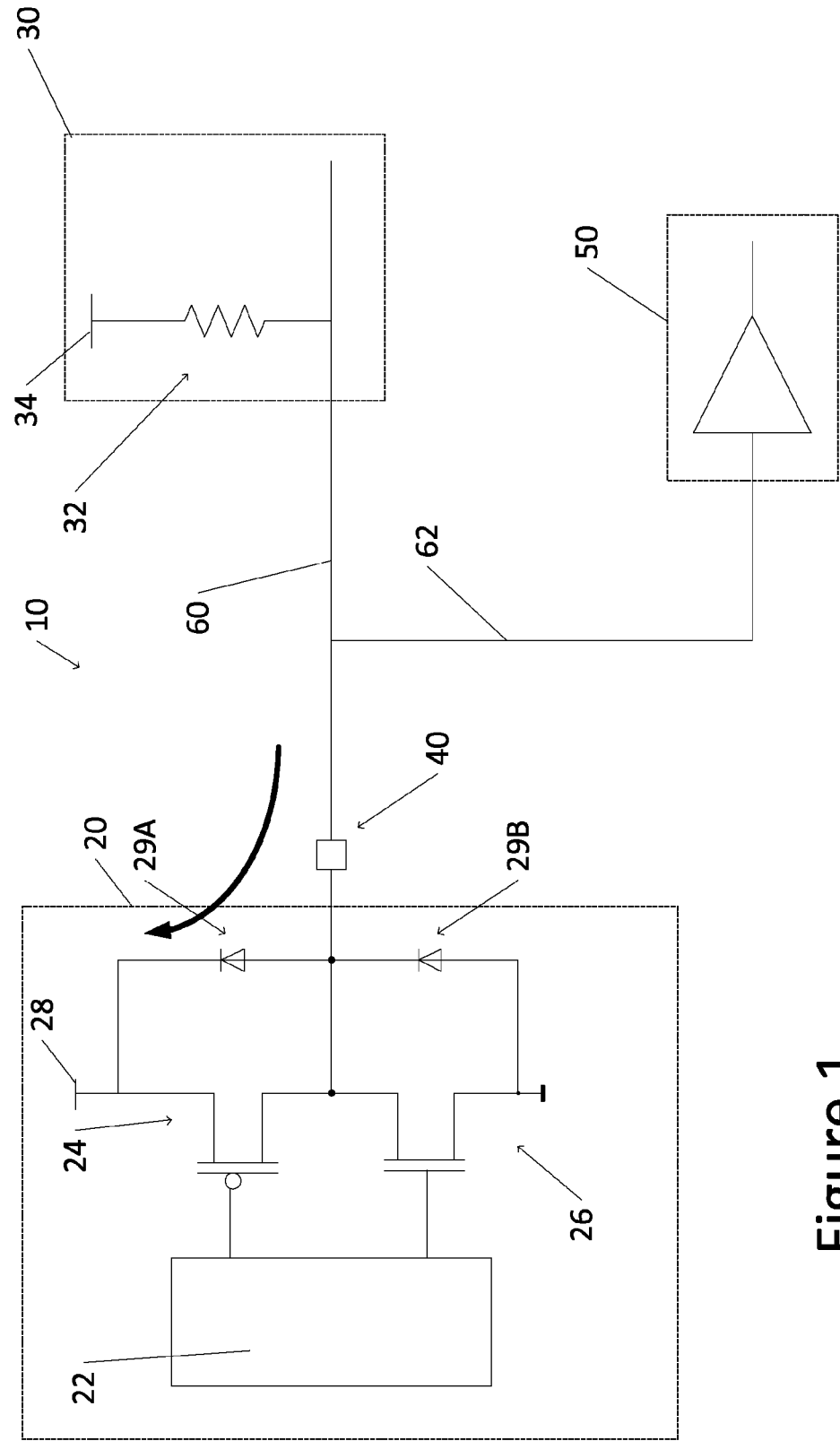
FIG. 1 is an example of a system operable in a power saving mode.

An example of a system operable in a power saving mode is shown in schematic form in FIG. 1.

FIG. 1 shows a system 10 in a power saving mode. The system 10 comprises a first component 20 and a second component 30.

The first component 20 comprises an output control 22, a p-mos transistor 24, and an n-mos transistor 26. The gates of the p-mos transistor 24 and the n-mos transistor 26 are coupled to the output control 22. In addition, the source of the p-mos transistor 24 is coupled to a power supply 28, and the drain of the p-mos transistor 24 is coupled in series to the drain of the n-mos transistor 26. The source of the n-mos transistor 26 is coupled to ground.

A first component diode 29A is coupled in parallel with the p-most transistor 24, with its cathode coupled to the power supply 28 and its anode coupled to the cathode of a second component diode 29B. The second component diode 29B is coupled in parallel with the nMOS transistor 26. The anode of the second component diode 29B is coupled to ground.

An I/O pin 40 is coupled to an output of the first component 20. The output of the first component is coupled to a junction which is coupled between and to the anode of the first component diode 29A and the cathode of the second component diode 29B. That junction is also coupled to a further junction which is coupled between and to the sources of the transistors 24, 26.

The I/O pin 40 is coupled to an input/output of the second component 30 via a line 60. The line 60 is coupled to a power controller 50 via a common line 62.

The input/output of the second component 30 is coupled via a resistor 32 to a power supply 34 of the second component 30.

In a first power saving mode, the first component 20 is off with no applied voltage (the power supply 28 disabled). Meanwhile the second component 30 is on or in a predefined power saving state (the power supply 34 enabled). Both components share the common line 62 to wake up the system through the power controller 50. However, the first component will wake up the system in a different system power saving mode, not the mode being described here.

In the first system power saving mode, when a wake signal on line 60 is asserted (grounded) by the second component then a wake event will be detected by the power controller 50 via common line 62. The power controller 50 will then do the appropriate tasks to respond to this event.

However, a problem is that when the wake event is not generated by the second component 30, a voltage from the power supply 34 of the second component is present on line 60 due to the internal pull-up in the second component 30. Moreover, since the power supply 28 of the first component is not supplying a voltage (an undetermined or floating voltage), the first component diode 29A (in parallel with the p-mos transistor 24) will be in an on state. Therefore, the voltage at the power supply 28 of the first component will be approximately the voltage of the power supply 34 of the second component minus the voltage drop of the first component diode 29A. In other words, a parasitic voltage will be present at the power supply 28 of the first component 20 that could cause parasitic power consumption in the first component or even problems like erratic functionality or latch-up.

One solution to this problem is to avoid sharing signals among subsystems that have different power state modes. In the example of FIG. 1, this can be by separating the wake signals from the first component and the second component by having separate lines to the power controller rather than having common line 62 coupled to the first and second component via line 60. However in most cases, such a solution is not feasible because of the large number of components in the system or the limited number of inputs for wakeup signals in the power controller. Even when such a solution is possible it can significantly increase the complexity and cost of the system.

In contrast, this disclosure presents a way of implementing isolation circuitry that enables the coupling of signals from different subsystems that manage different power mode states while avoiding parasitic supply through these interconnect signals. This can simplify the electronics power architecture, reducing complexity, cost and increasing the reliability of the system.

Advantages of the present disclosure include that it allows for the integration into a product of a complex system power state, that is a system which requires several levels of system power modes.

Furthermore, the present disclosure provides a way of providing isolation between components which is stand-alone and which automatically isolates one component in a low power or off mode and does not provide isolation in a normal 'active' mode of that component. This is achieved without complex control logic, thereby reducing complexity and cost.

In addition, the present disclosure enables the reduction of architecture cost. This can be achieved by using a single signal shared among several subsystems instead of a complex multi-signaling system. Therefore, with just one line, several inputs, such as wake inputs, can be managed for different components.

A simplified implementation also implies better reliability, and the disclosure enables new power components to be added with minimum impact in the system. The new components can use the isolation circuitry described herein and simply be connected to the sidebands signals required.

The present disclosure through simplification of the system also allows better debugging and troubleshooting.

Figure 2:
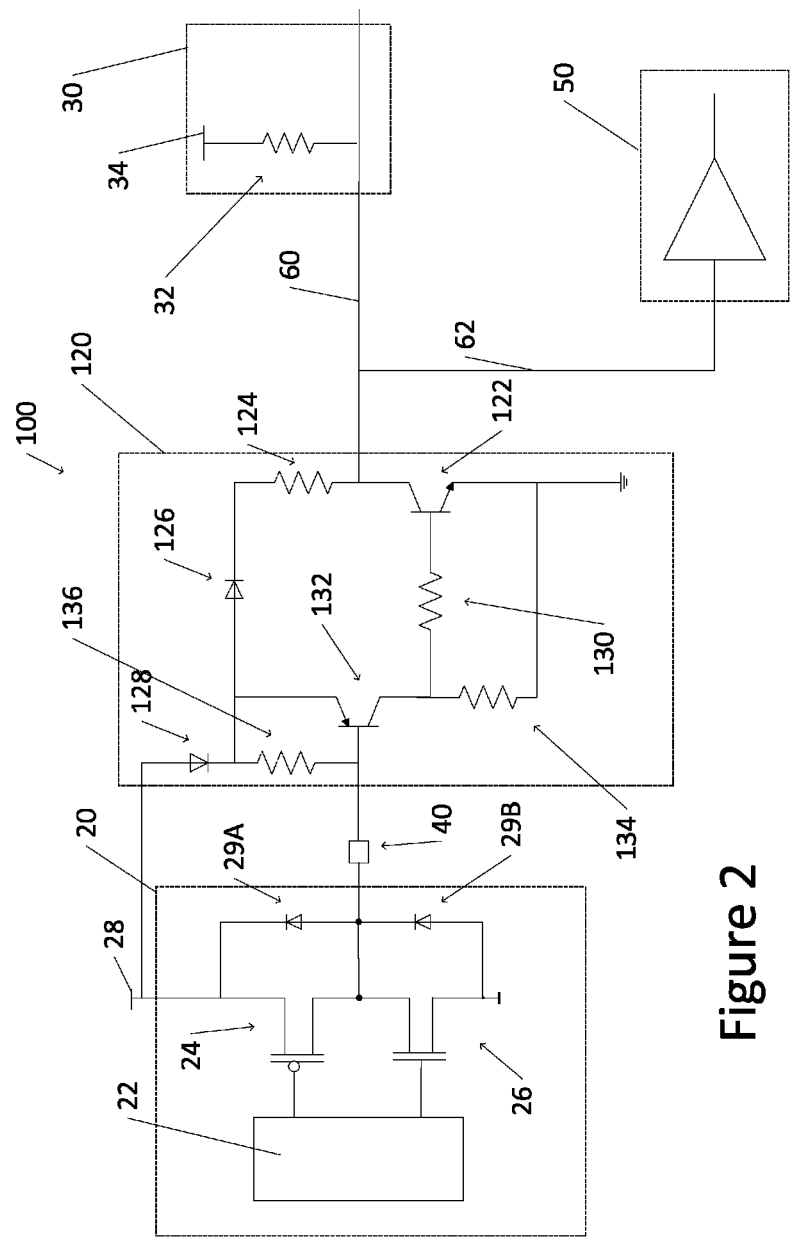
FIG. 2 is an example of a system operable in a power saving mode.

FIG. 2 shows in schematic form an example of a system using an isolation circuit.

A system 100 comprises a first component 20 and a second component 30. The first component 20 and the second component 30 are substantially as described in connection with FIG. 1 except as detailed below.

The system 100 further comprises an isolation circuit 120. The isolation circuit comprises a first transistor 122 which is an NPN transistor. The emitter of the first transistor 122 is coupled to ground and the collector of the first transistor 122 is coupled to an output of the isolation circuit 120. The output of the isolation circuit 120 is coupled to the input/output of the second component 30 via the line 60. The line 60 can be a single line. The line 60 is coupled to a power controller 50 via the common line 62.

The output of the isolation circuit 120 is also coupled via a resistor 124 to a cathode of a first diode 126. An anode of the first diode 126 is coupled to the cathode of a second diode 128, the anode of which second diode is coupled to the power supply 28 of the first component.

The base of the first transistor 122 is coupled via a resistor 130 to the collector of a second transistor 132. The second transistor 132 is a PNP transistor, the emitter of which is coupled to a junction on the line coupling the anode of the first diode 126 and the cathode of the second diode 128. The collector of the second transistor 132 is also coupled to ground via a resistor 134.

The base of the second transistor 132 is coupled to the I/O pin 40. A junction on the line coupling the I/O pin 40 and the base of the second transistor 132 is coupled via a resistor 136 to the cathode of the second diode 128.

The second transistor 132 is to drive the first transistor 122.

The resistors 136, 130, 124, and 134 can be considered a first resistor 136, a second resistor 130, a third resistor 124 and a fourth resistor 134.

The system 100 works in the following way.

When the first component 20 is in an off state and therefore no parasitic voltage is desired in the power supply 28, any voltage or current present on line 60 will be blocked from the first component 20 and its power supply 28 by the first and second diodes 126, 128, and the first transistor 122.

If the second component 30 grounds the line 60, this will not have any effect either in the power supply 28 of the first component 20, or in the I/O pin 40.

If the second component 30 is not asserting a wake signal and therefore the line 60 is at the voltage of the power supply 34 of the second component through the pull-up of the second component 30, this voltage is not present either in the power supply 28 of the first component, or in the I/O pin 40, due to the blocking effect of the first and second diodes 126, 128, and the first transistor 122.

When the first component 20 is in an on state or in a power saving mode and it is to manage a wake signal, the system functions as follows.

If the wake signal should be deasserted (open collector), the pMOS transistor 24 in the first component 20 should be active (as usual). In this way, the voltage present at the base of the second transistor 132 is high and the second transistor 132 is not in conduction. This is because in this example the second transistor 132 is a PNP transistor. The base of the first transistor 122 will therefore be grounded. Accordingly, the first transistor 122 will not be in conduction either, leaving the output of the isolation circuit 120, and therefore line 60, at the voltage of the power supply 28 of the first component minus the voltage drops over the first and second diodes 126, 128 and the third resistor 124. The wake signal (signal on line 60) will therefore be de-asserted.

When a wake signal must be asserted (grounded), the nMOS transistor 26 in the first component 20 should be on. In this way, the first and second transistors 122, 132 will be on and the voltage at the output of the isolation circuit 120 and therefore on line 60 will be the collector-emitter voltage in saturation of the first transistor 122 (often around 0.2V)

The first and second diodes 126, 128, and the third resistor 124, are selected to ensure a minimum high level voltage on the line 60, and therefore at an input of the power controller 50.

Various modifications may be made to the example of FIG. 2. For example, components other than those described as the first and second components can be used. In addition, the isolation circuit 120 can be implemented on lines other than those designed to carry a wake signal. As described above, components can often share a variety of interconnect signals, any of which are susceptible to unintentionally transferring parasitic supply to a component in a low power or an off mode. The isolation circuit 120 described above can be used for any of those signals.

Furthermore, although the first transistor 122 is described as being NPN and the second transistor is described as being PNP, these can be interchanged. However, in such a modification, the emitters and collectors should be the other way round as compared with the example of FIG. 2. In other words, the collector of first transistor 122 should be coupled to ground and the emitter of first transistor 122 should be coupled to the output of the isolation circuit 120. The emitter and collector of second transistor 132 would correspondingly be interchanged.

Additionally, instead of NPN and PNP transistors, N-channel and P-channel MOS transistors can be used, respectively. For those examples, references in the description above and claims below to the base, collector and emitter should also be considered as references to the gate, drain and source.

Where the description above describes something as being coupled to ground, this does not need to be 0V but should create a potential difference with respect to the power supplies 28, 34.

In addition, one or more of the diodes described above can be a Schottky diode. This can minimise the voltage drop across the diode.

Where two elements are described herein as being coupled, they can be directly coupled or connected; that is to say that there are no intermediate components.

Where two elements are described as being coupled via a third element, that third element can be the only intermediate element on the coupling.

The invention claimed is:

1. A system comprising a first component operable in a plurality of modes coupled to a second component via an isolation circuit, the isolation circuit comprising:
   a first diode coupled between a power supply of the first component and an output of the isolation circuit, the output of the isolation circuit being coupled to the second component; and
   a first transistor the base of which is coupled to an output of the first component, wherein a first one of the collector and emitter of the first transistor is coupled to the output of the isolation circuit;
   whereby in a low power mode of the first component, parasitic supply from the output of the isolation circuit is blocked from the power supply of the first component and from the output of the first component by the first transistor and the first diode,
   wherein the first diode is a Schottky diode.

2. The system of claim 1, wherein the anode of the first diode is coupled to the power supply of the first component and the cathode of the first diode is coupled to the output of the isolation circuit.

3. The system of claim 1, wherein the isolation circuit further comprises a second transistor to drive the first transistor, the second transistor being coupled between the base of the first transistor and the output of the first component, wherein the base of the second transistor is coupled to the output of the first component and the base of the first transistor is coupled to a first one of the collector and emitter of the second transistor, a second one of the collector and emitter of the second transistor being coupled to the output of the isolation circuit.

4. The system of claim 3, wherein one of the first and second transistors is an N-channel or NPN transistor, and the other is a P-channel or PNP transistor.

5. The system of claim 3, wherein the collector of the first transistor is coupled to the output of the isolation circuit and the first transistor is an N-channel or NPN transistor, and wherein the second transistor is a P-channel or PNP transistor the emitter of which is coupled to the output of the isolation circuit and the collector of which is coupled to the base of the first transistor.

6. The system of claim 3, wherein the isolation circuit further comprises a second diode coupled between the power supply of the first component and the first diode whereby the power supply of the first component is coupled to the first diode via the second diode; wherein the second one of the collector and emitter of the second transistor is coupled to the output of the isolation circuit via the first diode.

7. The system of claim 6, wherein the anode of the second diode is coupled to the power supply of the first component and the cathode of the second diode is coupled to the anode of the first diode, and wherein the second one of the collector and emitter of the second transistor is coupled to the output of the isolation circuit via the anode of the first diode.

8. The system of claim 7, wherein a cathode of the second diode is coupled via a first resistor to the base of the second transistor.

9. The system of claim 3, wherein the base of the first transistor is coupled to the first one of the collector and emitter of the second transistor via a second resistor.

10. The system of claim 1, wherein the first diode is coupled to the output of the isolation circuit via a third resistor.

11. The system of claim 2, wherein the cathode of the first diode is coupled to the output of the isolation circuit via a third resistor.

12. The system of claim 1, wherein a second one of the collector and emitter of the first transistor is coupled to ground.

13. The system of claim 3, wherein the first one of the collector and emitter of the second transistor is coupled to ground via a fourth resistor.

14. A system comprising a first component operable in a plurality of modes coupled to a second component via an isolation circuit, the isolation circuit comprising:
   a first diode the anode of which is coupled to a power supply of the first component and the cathode of which is coupled to an output of the isolation circuit, the output of the isolation circuit being coupled to the second component;
   a first transistor the base of which is coupled to an output of the first component, wherein a first one of the collector and emitter of the first transistor is coupled to the output of the isolation circuit;
   a second transistor to drive the first transistor, the second transistor being coupled between the base of the first transistor and the output of the first component, wherein the base of the second transistor is coupled to the output of the first component and the base of the first transistor is coupled to a first one of the collector and emitter of the second transistor, a second one of the collector and emitter of the second transistor being coupled to the output of the isolation circuit via the anode of the first diode;
   a second diode the anode of which is coupled to the power supply of the first component and the cathode of which is coupled to the anode of the first diode whereby the power supply of the first component is coupled to the first diode via the second diode;
   whereby in a low power mode of the first component, parasitic supply from the output of the isolation circuit is blocked from the power supply of the first component and from the output of the first component by the first transistor and the first and second diodes.

15. A method of isolating a first component from parasitic supply from a second component wherein the second component is for coupling to the first component; the method comprising coupling the first component to the second component via an isolation circuit, the isolation circuit comprising:
   a first diode coupled between a power supply of the first component and an output of the isolation circuit, the output of the isolation circuit being coupled to the second component;
   a first transistor the base of which is coupled to an output of the first component and one of the collector and emitter of which is coupled to the output of the isolation circuit;
   a second transistor to drive the first transistor, the second transistor being coupled between the base of the first transistor and the output of the first component, wherein the base of the second transistor is coupled to the output of the first component and the base of the first transistor is coupled to a first one of the collector and emitter of the second transistor, a second one of the collector and emitter of the second transistor being coupled to the output of the isolation circuit; and
   a second diode coupled between the power supply of the first component and the first diode whereby the power supply of the first component is coupled to the first diode via the second diode; wherein the second one of the collector and emitter of the second transistor is coupled to the output of the isolation circuit via the first diode;

whereby in a low power mode of the first component, parasitic supply from the output of the isolation circuit is blocked from the power supply of the first component and from the output of the first component by the first transistor and the first diode, wherein the anode of the second diode is coupled to the power supply of the first component and the cathode of the second diode is coupled to the anode of the first diode, and wherein the second one of the collector and emitter of the second transistor is coupled to the output of the isolation circuit via the anode of the first diode.

16. The method of claim 15, wherein the anode of the first diode is coupled to the power supply of the first component and the cathode of the first diode is coupled to the output of the isolation circuit.

* * * * *